United States Patent [19]

Bechtel

[11] 4,223,195
[45] Sep. 16, 1980

[54] PULSE TRANSFORMER

[75] Inventor: Jon H. Bechtel, Holland, Mich.

[73] Assignee: Robertshaw Controls Company, Richmond, Va.

[21] Appl. No.: 931,201

[22] Filed: Aug. 4, 1978

[51] Int. Cl.² .................... H05B 9/06; G05F 3/00
[52] U.S. Cl. ...................... 219/10.55 B; 323/24; 331/112
[58] Field of Search ............... 219/10.55 B, 10.55 R; 323/34, 24, 22 SC; 331/112

[56] References Cited

U.S. PATENT DOCUMENTS

| 3,302,060 | 1/1967 | Blok et al. ............... 219/10.55 B X |
| 3,383,623 | 5/1968 | Vercellotti et al. ............. 323/34 UX |
| 3,831,079 | 8/1974 | Iwata ............................. 323/34 X |

Primary Examiner—Arthur T. Grimley
Attorney, Agent, or Firm—Fulwider, Patton, Rieber, Lee & Utecht

[57] ABSTRACT

A pulse transformer is provided for triggering a magnetron in a microwave oven from a low level d.c. control signal. A step-up transformer has a secondary connected to a magnetron triac and a primary connected to a blocking oscillator circuit. The blocking oscillator circuit utilizes a single transistor, at the base of which there is a biasing compacitor. The system is activated by grounding of a control lead in a microprocessor controller for the microwave oven. Grounding of the control lead charges the biasing capacitor until the transistor conducts. Transistor conduction produces a feedback which discharges the capacitor. The circuit electrically isolates the high voltage, high current magnetron power system from the microprocessor controller.

7 Claims, 2 Drawing Figures

PULSE TRANSFORMER

BACKGROUND OF THE INVENTION

1. Field of the Invention

The present invention relates to magnetron control circuits for use in powering a magnetron in a microwave oven.

2. Description of the Prior Art

In conventional microwave ovens, microwaves are generated by a magnetron which is triggered for repetitive portions of an a.c. power signal cycle under the control of a large triac. The triac is gated by a control signal, typically emanating from a microprocessor controller.

It is highly desirable for the magnetron control circuitry to be electrically isolated from the microprocessor. Because of the high voltages and currents present in the magnetron control system, any discharge therefrom back through the control circuitry into the microprocessor controller can result in irreparable damage to the expensive microprocessor controller, or in injury to the oven operator. Unless precautions are taken, the oven operator can receive an electrical shock from the oven temperature probe, time and temperature dials, and other low voltage operating controls in the system. In the event of a malfunction, the absence of electrical isolation of the magnetron can result in a voltage and current feedback through the microprocessor which posses a threat of serious energy to persons coming in contact with the otherwise harmless controls. Accordingly, electrical isolation of the magnetron power circuit is a highly desirable feature.

In the past, various techniques have been employed to electrically isolate the magnetron power circuitry from operating controls which one might touch. One such technique is to employ a light emitting diode at the control signal line output of the microprocessor controller and a corresponding light senstive diode coupled to the magnetron power circuit. Both the light emitting and the light sensitive diodes are located in a darkened enclosure. Such an arrangement establishes the necessary electrical isolation of the magnetron power circuit. However, such a circuit is relatively expensive and requires considerable space in a circuit enclosure which is quite limited as to availability of space. Specifically, a housing to provide the necessary shielding for the light sensitive and light emitting diodes is necessarily voluminous, compared to the other solid state components on the printed circuit oven control board, and represents a signficant sacrifice in available space in a circuit enclosure which is typically only a few cubic inches in volume.

Other types of electrical isolation include transformer circuits in which voltage and current levels are closely regulated on the primary leads. This prevents inordinately large voltage and current feedback in instances of malfunctions. However, such an arrangement as heretofore involved unnecessary complexity in the microprocessor program. In order to provide an actuating signal. A timed output from the microprocessor is typically required so as to trigger an inductive output from a control transformer. This requires gating through an oscillator signal from one of the master oscillators of the microprocessor control system and a recurring servicing program routine that occupies the microprocessor to the neglect of other control functions.

Another prior art arrangement that avoids extensive programming utilizes a relaxation oscillator circuit as a substitute for program controlled gating pulse timing. However, such arrangements are quite slow and do not begin delivering regular gating pulses smoothly until after a certain settling period.

SUMMARY OF THE INVENTION

The present invention avoids the needless complexity of a control transformer circuitry heretofore employed by employing a pulse transformer that operates on a low level d.c. signal from the microprocessor. Specifically, the present invention employs a blocking oscillator circuit which is activated by the occurrence of a d.c. signal from the microprocessor to emit a series of pulses that generate inductive outputs in a control transformer secondary. The secondary is connected to the gate of a triac that drives the magnetron transformer. Thus, a very simple control circuit is formed which establishes electrical isolation of the magnetron from the microprocessor control, but which involves only minimal programming requirements for the microprocessor. The low level d.c. signal by the microprocessor specifies, by merely an appropriate d.c. level, whether or not the magnetron is to be driven.

The blocking oscillator circuit employs a single transistor which has a biasing capacitor at its base. A path of electrical connection from a voltage supply is established through the biasing capacitor to the microprocessor control through a low level d.c. control signal line. When the microprocessor grounds the control signal line connection to complete a charging circuit, the voltage supply acts upon the capacitor to build up a charge thereon to bias the transistor to conduction. The transistor circuit includes a feedback so that once conduction is initiated, transistor feedback through the pulse transformer primary discharges the biasing capacitor. Concurrently, of course, as soon as the transistor begins to conduct, a current is induced in the transformer secondary to gate the triac to turn on the magnetron. The triac will stay on until the next zero crossing in the 120 volt 60 hertz line current therethrough, at which time it will turn off. The triac is turned on again by a subsequent triggering pulse from the blocking oscillator as the control transistor ceases to conduct.

Preferably the low level d.c. control line connection to the microprocessor is also connected to a voltage limiting circuit, which limits voltage reflected back to the microprocessor from the pulse transformer circuitry. In many instances, microprocessors are strictly limited as to tolerable voltage. For example, in the MM75 Microprocessor manufactured by Rockwell International, Microelectronies Device Division, 3310 Miraloma Avenue, Anaheim, California 92803 the control inputs cannot tolerate a positive voltage or an excessive negative voltage.

The invention may be explained with greater clarity and particularity by reference to the accompanying drawings.

DESCRIPTION OF THE EMBODIMENT

Figure 1:
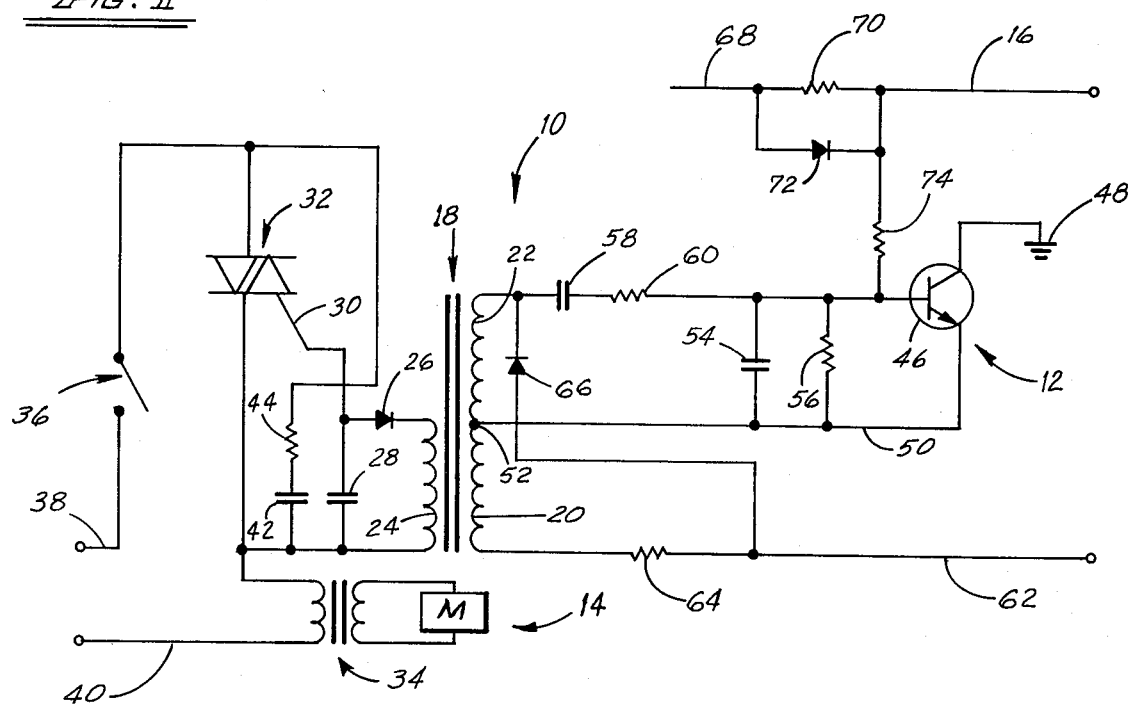
FIG. 1 is a schematic diagram of a pulse transformer circuit operative from a low level d.c. signal.

FIG. 1 illustrates a pulse transformer circuit 10 in which a blocking oscillator, formed by a transistor 12, operates to trigger a magnetron 14 from a low level d.c. signal from a microprocessor 15 appearing on line 16. In conventional practice, the low level d.c. control signal line 16 is connected to a MM75 Microprocessor 15. Line 16 will typically be grounded to initiate actuation of the magnetron 14 and will remain open to inhibit the output of actuating signals to the magnetron 14.

The pulse transformer circuit includes a step-up a.c. transformer 18 having a primary winding divided into sections 20 and 22 and a secondary winding 24. The secondary winding 24 is coupled in a secondary circuit to trigger the magnetron 14 when actuated by the signal appearing on line 16 from the microprocessor. The transformer secondary 24 is connected in series with a rectifying diode 26, and a 0.01 microfarad capacitor 28 is connected across the terminals of the secondary 24 to prevent interference coupled into line 30 from turning on the triac 32. The gating line 30 is connected to the gating input of a triac 32, which is coupled in circuit with the primary of a magnetron transformer 34. 120 volt 60 hertz alternating current flows through the primary of the magnetron transformer 34, through the triac 32, and through conventional door interlock and other interlock switches, indicated generally at 36 on lines 38 and 40. The secondary of the magnetron transformer 34 is coupled to drive the magnetron 14 to generate microwaves within the oven enclosure. The diode 26 in the pulse transformer secondary assures that the inductance of the transformer secondary 24 cannot cause the triac 32 to lock on. It is also possible for the triac 32 to lock on due to rapid changes in the blocking voltage at the instant of turn off. These rapid voltage changes are caused by the inductance of the magnetron load. This cause of lock on is prevented by a snubbing network formed by the capacitor 42 and the resistor 44 which suppress rapid voltage changes across the triac. The 0.7 microfarad capacitor 42 and the 100 ohm resistor 44 provided in parallel with the triac 32 also prevent damage to the triac should any voltage surges occur in the lines 38 and 40. The capacitor 42 also aids in minimizing unwanted triggering of the triac 32 due to noise.

The blocking oscillator 12 is formed by a single GES 2222A transistor 46 which as a collector connection to ground at 48 and an emitter feedback connection on line 50 to a tap 52 which divides the sections 20 and 22 of the primary of the pulse transformer 18. An RC network, formed by a 0.01 microfarad ceramic disk capacitor 54 and a 4.7K resistor 56 form a noise suppression circuit to prevent actuation of the transistor 46 by sporadic noise pulses. The resistor 56 prevents leakage currents from transistor 46 or from the control signal input line 16 from turning transistor 46 on.

The pulse transformer circuit also includes a biasing capacitor 58 having a value of 0.047 microfarads which is used to provide a bias to the base of the transistor 46 to allow emitter-collector current to flow. A 100 ohm resistor 60 is interposed between the biasing capacitor 58 and the base of the transistor 46. Together the values of the capacitor 58 and the resistor 60 control the length of time which the transistor 46 remains on.

A voltage supply input, nominally a −27 volt supply d.c., is provided on line 62 to the primary of the step-up transformer 18. From the voltage supply line 62 parallel connections exist through an 18 ohm, ¼ watt resistor 64 to the primary sections 20 and 22 and in a shunt across the primary winding through a diode 66. Diode 66 provides a path for magnetizing current in primary section 20 to continue to flow when transistor 46 switches off. The combined voltage drop due to the resistances of resistor 64 and primary sections 20 and 22 and the voltage drop across diode 66 cause the magnetizing current to decay between output pulses. It is important that this current does decay to a small value before the next pulse. This requirement limits the pulse duty cycle to not much over 10%.

The −27 volt supply is also connected to a supply line 68 which is coupled through a 47K resistor 70 to the control signal line 16. Resistor 70 prevents the voltage at the control signal line 16 from going positive. A parallel connection through a diode 72 by-passes the resistor 70 and operates to prevent the control signal line 16 from going more than 0.6 volts below the negative supply on line 68. 12K resistor 74 is connected to the base of the transistor 46 in series with the control signal line 16 to complete a charging circuit from the voltage supply line 62. The values of resistor 74 and capacitors 58 determine the off time of transistor 46. The resistor 70 and diode 72 are not necessary for the operation of the blocking oscillator 12, but do function, with their connection to the −27 volt supply line 68, to limit the voltage reflected back to the microprocessor 15 coupled to the control signal line 16.

The circuit of FIG. 1 can operate on from a −15 to a −30 volt d.c. supply, which is connected to voltage supply lines 62 and 68, and delivers a pulse rate of 11 kilohertz to trigger the triac 32. In the operation of the circuit, when the control signal line 16 is open, or switched to a negative voltage supply, the circuit of FIG. 1 is idle. On the other hand, when the control signal line 16 is coupled to ground by the system microprocessor 15, the blocking oscillator 12 is turned on. With the control signal line 16 grounded, current through resistor 74 charges the capacitor 58 and turns on the transistor 46 when the voltage between the base and emitter of the transistor 46 reaches about 0.6 volts. Positive feedback from the transformer winding section 22 supplies base drive through the resistor 60 and the capacitor 58 discharging the capacitor 58. The transistor 46 remains in a saturated condition until the voltage on capacitor 58 rises in the opposite direction from that provided on supply line 62 to the point that the base drive to transistor 46 is inadequate. The voltage across transistor 46 rises, reducing the voltage on the primary section 20, and thus reducing the base drive from the primary section 22. Turn off of the transistor 46 is rapid. Transistor 46 remains off until capacitor 58 is again charged through the resistor 74 from the voltage supply line 62 through resistor 64 and transformer windows 20 and 22.

Figure 2:
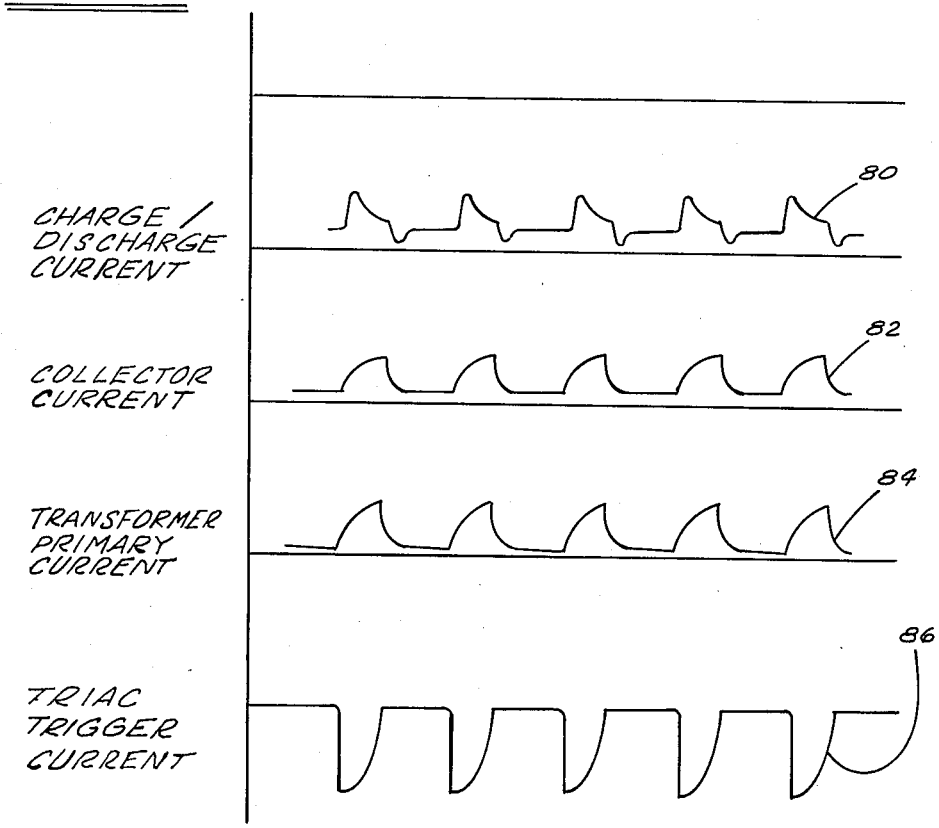
FIG. 2 is a timing diagram of wave forms of pulses appearing in the circuity of FIG. 1.

Various of the wave forms of pulses in the system are depicted in FIG. 2. The current in the capacitor 58 and the resistor 60, which provides the bias to the transistor 46, is depicted by the wave form designated 80 in FIG. 2. It can be seen that this current rises rapidly with the conduction through resistor 60 when the control signal line 16 is grounded. Once the transistor 46 begins to conduct, the capacitor 58 is discharged, and ultimately charged oppositely when the transformer primary sections 20 and 22 are pulsed. The collector current in transistor 46 is depicted at 82 in FIG. 2. The peak collector current is 375 miliamps with a 30 volt supply.

The transformer primary current is depicted at 84 in FIG. 2. Initially, this current increases rapidly when transistor 46 conducts. A sudden decrease occurs following the current peak when the transistor 46 turns off and current is deverted into primary winding section 22 and the diode 66. However, current is still being supplied to the triac gate causing a fairly rapid rate of decay. Once the triac current ceases, however, decay continues prior to the next pulse, but at a much lower rate. The triac trigger current is depicted at 86.

It is possible for the diode 66 to be placed in parallel across only the primary winding section 20, rather than also across both primary winding sections 20 and 22. This results in better limiting of the voltage across transistor 46, but renders the circuit subject to possible shock into an uncontrolled high frequency mode of oscillation. In this unwanted mode, the self-resonance of the transformer 18 makes the circuit function somewhat like a Hartly oscillator. This high frequency oscillation does not occur with placement of the diode 66 as indicated in FIG. 2 to include the winding section 22 of the primary coil winding. A 0.015 inch thickness of tape between the transformer primary sections 20 and 22 and secondary winding 24 reduces interwinding capacitance to about 20 picofarads and provides electrical isolation. By placing the diode 6 across both of the sections 20 and 22 of the primary winding, any self-resonant oscillation of the blocking oscillator 12 is quelled.

The pulse transformer of the present invention provides a very high speed oscillation and a strong gating pulse to the triac 32 from the very inception of actuation. The blocking oscillator 12 of the present invention delivers pulses at a rate of 10 or 11 kilohertz and the current reaching the triac 32 is approximately 400 miliamps. The average current drawn from the voltage supply 62 to produce this output oscillation is only about 25 miliamps. Significantly, other devices, such as resonant oscillators, require a much bigger current level into the oscillation device. Also, the first few pulses delivered with the resonant oscillator are quite weak, in contrast to the pulses of the present invention wherein the first gating pulse to the triac 32 is just as strong as the last.

While various component specifications and alternative circuit configurations have been described and a preferred embodiment of the invention depicted in the drawings, it is to be understood that various modifications and alterations of the invention can readily be made. Accordingly, the invention should not be construed as limited to the specific embodiments contemplated, but rather is defined in the claims appended hereto.

What is claimed is:

1. A pulse transformer circuit for triggering a magnetron in a microwave oven from a low level d.c. signal comprising:
    an a.c. transformer having secondary and primary windings wherein said secondary is coupled in a secondary circuit to trigger said magnetron when actuated,
    a blocking oscillator circuit employing a single transistor connected with an output to said primary winding and having a biasing capacitor at its base and a discharging feedback connection from said output of said transistor to said biasing capacitor;
    a voltage supply connected to said primary winding and with a shunt connection to said biasing capacitor to charge said biasing capacitor; and
    a low level d.c. control signal line connection to complete a charging circuit from said voltage supply and through said biasing capacitor.

2. A pulse transformer according to claim 1 further characterized in that a first resistor is connected in series between said biasing capacitor and the base of said transistor, and a second resistor is connected in series in said charging circuit in said control signal line.

3. A pulse transformer according to claim 2 further comprising:
    a feedback connection from said transistor output to an intermediate point in said primary winding.

4. A pulse transformer according to claim 3 further comprising a smoothing capacitor and a smoothing resistor connected in parallel to each other between said transistor output and said transistor base.

5. A pulse transformer according to claim 2 further comprising a diode located in said shunt connection of said voltage supply across said primary winding.

6. A pulse transformer according to claim 2 further chacterized in that said signal line connection is coupled to a microprocessor, and also to a voltage limiting circuit to limit voltage feedback to said microprocessor.

7. A pulse transformer according to claim 1 wherein said a.c. transformer is a step-up transformer and said secondary circuit includes a magnetron transformer having a magnetron coupled in its secondary, a triac coupled to power the primary of said magnetron transformer, a gating connection from said secondary of said step-up transformer to the gate of said triac, a rectifying diode in said gating connection, and a smoothing capacitor coupled in parallel across said secondary of said step-up transformer.

* * * * *